(12) United States Patent
Iniewski et al.

(10) Patent No.: US 11,733,408 B2
(45) Date of Patent: Aug. 22, 2023

(54) HIGH-PERFORMANCE RADIATION DETECTORS AND METHODS OF FABRICATING THEREOF

(71) Applicant: REDLEN TECHNOLOGIES, INC., Saanichton (CA)

(72) Inventors: Krzysztof Iniewski, Coquitlam (CA); Michael K. Jackson, Victoria (CA); Michael Ayukawa, Victoria (CA)

(73) Assignee: REDLEN TECHNOLOGIES, INC., Saanichton (CA)

( * ) Notice: Subject to any disclaimer, the term of this patent is extended or adjusted under 35 U.S.C. 154(b) by 306 days.

(21) Appl. No.: 17/225,416

(22) Filed: Apr. 8, 2021

(65) Prior Publication Data

US 2021/0333420 A1 Oct. 28, 2021

Related U.S. Application Data

(60) Provisional application No. 63/016,541, filed on Apr. 28, 2020.

(51) Int. Cl.
*G01T 1/29* (2006.01)
*H01L 27/146* (2006.01)

(52) U.S. Cl.
CPC ........ *G01T 1/2928* (2013.01); *H01L 27/1463* (2013.01); *H01L 27/14658* (2013.01); *H01L 27/14696* (2013.01)

(58) Field of Classification Search
CPC ... G01T 1/2928; G01T 1/241; H01L 27/1463; H01L 27/14658; H01L 27/14696
See application file for complete search history.

(56) References Cited

U.S. PATENT DOCUMENTS

| | | |
|---|---|---|
| 5,905,264 A | 5/1999 | Shahar et al. |
| 6,043,106 A | 3/2000 | Mescher et al. |
| 6,046,068 A | 4/2000 | Orava et al. |
| 6,168,967 B1 | 1/2001 | Hoffbauer et al. |
| 6,188,089 B1 | 2/2001 | Spartiotis |
| 6,215,123 B1 | 4/2001 | Orava et al. |
| 6,410,922 B1 | 6/2002 | Spartiotis et al. |
| 7,589,324 B2 | 9/2009 | Chen et al. |
| 7,955,992 B2 | 6/2011 | Chen et al. |
| 8,093,094 B2 | 1/2012 | Stahle et al. |
| 8,314,395 B2 | 11/2012 | Zhang et al. |
| 8,476,101 B2 | 7/2013 | Chen et al. |
| 8,492,728 B2 | 7/2013 | Antonuk |

(Continued)

OTHER PUBLICATIONS

Bolotnikov et al., "Charge Loss Between Contacts of CdZnTe Pixel Detectors", Nucl. Instr. and Meth. A, (1999), 432, 326-331.

(Continued)

*Primary Examiner* — Tony Ko
(74) *Attorney, Agent, or Firm* — The Marbury Law Group PLLC

(57) ABSTRACT

A radiation detector includes a semiconductor layer having opposing first and second surfaces, anodes disposed over the first surface of the semiconductor layer in a pixel pattern, a cathode disposed over the second surface of the semiconductor layer, and an electrically conductive pattern disposed over the first surface of the semiconductor layer in interpixel gaps between the anodes. At least a portion of the electrically conductive pattern is not electrically connected to an external bias source.

20 Claims, 9 Drawing Sheets

(56) References Cited

U.S. PATENT DOCUMENTS

| | | | |
|---|---|---|---|
| 8,614,423 | B2 | 12/2013 | Chen et al. |
| 9,202,961 | B2 | 12/2015 | Chen et al. |
| 9,847,369 | B2 | 12/2017 | El-Hanany et al. |
| 10,203,420 | B2 | 2/2019 | Lu et al. |
| 10,276,627 | B2 | 4/2019 | El-Hanany et al. |
| 2008/0149844 | A1 | 6/2008 | Chen et al. |
| 2010/0032579 | A1 | 2/2010 | Chen et al. |
| 2011/0156198 | A1 | 6/2011 | Chen et al. |
| 2013/0126999 | A1 | 5/2013 | Rusian et al. |
| 2016/0240584 | A1* | 8/2016 | El-Hanany ........ H01L 27/14661 |
| 2017/0104026 | A1* | 4/2017 | Roch .................. H01L 27/1461 |
| 2018/0033822 | A1 | 2/2018 | El-Hanany et al. |
| 2018/0329079 | A1 | 11/2018 | Lu et al. |
| 2022/0085086 | A1* | 3/2022 | Kim .................... H01L 27/1463 |
| 2022/0149088 | A1* | 5/2022 | Im ...................... H01L 27/1463 |
| 2022/0336506 | A1* | 10/2022 | Lee .................. H01L 27/14614 |

OTHER PUBLICATIONS

Chen et al., "Passivation of CdZnTe surfaces by oxidation in low energy atomic oxygen", J. Vac. Sci. Technol. A, 1999, 17(1), 97-101.

Mescher et al., "Development of Dry Processing Techniques for CdZnTe Surface Passivation", Journal of Electronic Materials, 1999, 28, 700-704.

Nemirovski et al., "Plasma anodization of $Hg_{1-x}Cd_xTe$", Appl. Phys. Lett., 1980, 37(9), 813-815.

Prettyman et al., "Performance of CdZnTe detectors passivated with energetic oxygen atoms", Nuclear Instruments and Methods in Physics Research A, 1999, 422, 179-184.

Stahle et al., "Fabrication of CdZnTe strip detectors for large area arrays", Proc. SPIE Hard X-Ray and Gamma-Ray Detector Physics, Optics, and Applications, 1997, 3115, 90-97.

International Search Report and Written Opinion for PCT/IB2016/050552, dated Apr. 1, 2016, 9 pages.

International Preliminary Report on Patentability for International Patent Application No. PCT/IB2016/050552, dated Aug. 31, 2017, 7 pages.

* cited by examiner

US 11,733,408 B2

HIGH-PERFORMANCE RADIATION DETECTORS AND METHODS OF FABRICATING THEREOF

FIELD

The present application is directed to the field of radiation detectors and methods of fabricating the same.

BACKGROUND

The subject matter disclosed herein relates generally to radiation detectors for medical imaging, such as in Low-Flux applications in Nuclear Medicine (NM), whether by Single Photon Emission Computed Tomography (SPECT) or by Positron Emission Tomography (PET), or as radiation detectors in High-Flux applications as in X-ray Computed Tomography (CT) for medical applications and for non-medical imaging application such as in baggage scanning.

Room temperature pixelated radiation detectors made of semiconductors, such as Cadmium Zinc Telluride (CdZnTe or CZT), are gaining popularity for use in medical and non-medical imaging. These applications dictate that these detectors have to exhibit both high energy resolution and high sensitivity. Since these detectors form a crucial part of complex imaging systems they should be highly reliable with a cost low enough to suit market requirements.

Semiconductor radiation detectors generally include two surfaces, one having a plurality of pixelated anode electrical contacts, and the second having a monolithic cathode electrical contact. Prior to the application of the electrical contacts, the first and the second surfaces are commonly etched by chemical wet etching. For CZT radiation detectors, the wet etching is performed in order to remove the mechanical damage from the first and second surfaces. This damage is introduced by previous fabrication steps where the semiconductor wafers have been sliced and polished to form surfaces. Furthermore, the wet etching forms tellurium rich surfaces, which is used to produce electrical contacts with favorable characteristics.

The tellurium rich first surface on which the anode contacts are applied have non-metallized regions between the anode contacts. The excess tellurium in these regions causes reduced surface resistance between the contact pads. It has been shown in an article by Bolotnikov et al., "Charge Loss Between Contacts Of CdZnTe Pixel Detectors", Nucl. Instr. and Meth. A, (1999), 432, 326-331 that these low surface resistance surfaces between the anode contact pads cause charge loss of the events attracted to the anode contacts. This incomplete charge collection causes impairment of the energy resolution and the sensitivity of these detectors. Furthermore, low surface resistance has been shown to degrade the signal stability over time. This instability results in detectors that are unreliable.

SUMMARY

Various embodiments provide a radiation detector which includes a semiconductor layer having opposing first and second surfaces, anodes disposed over the first surface of the semiconductor layer in a pixel pattern, a cathode disposed over the second surface of the semiconductor layer, and an electrically conductive pattern disposed over the first surface of the semiconductor layer in interpixel gaps between the anodes. At least a portion of the electrically conductive pattern is not electrically connected to an external bias source.

According to another embodiment, a method of operating the radiation detector includes applying an external voltage between the cathode and the anodes, and not applying an external voltage to the at least portion of the electrically conductive pattern during the step of applying an external voltage between the cathode and the anodes. The electrons may move vertically in the interpixel gaps from the semiconductor layer into the electrically conductive pattern during the step of applying an external voltage between the cathode and the anodes.

BRIEF DESCRIPTION OF THE DRAWINGS

FIG. 6G schematically illustrates a side cross sectional view of attaching the device of FIG. 6F to a carrier.

DETAILED DESCRIPTION

Figure 1:
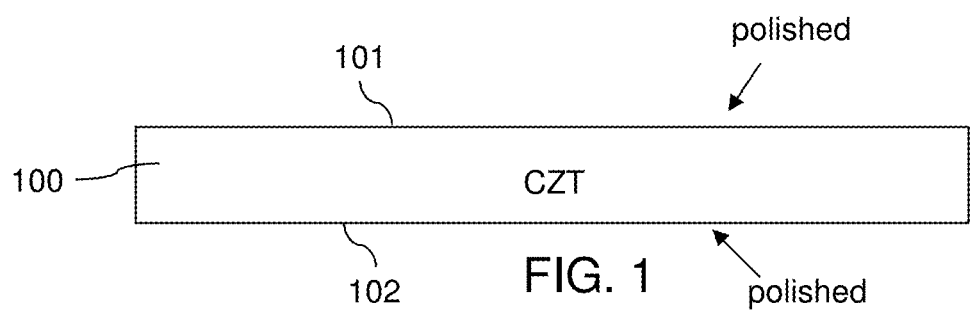
FIG. 1 is a side cross section view of a schematic of the first processing step of producing a radiation detector from the semiconductor wafer 100 that may be made of a CZT wafer, with a top, first surface 101 and a lower, second surface 102, which are mechanically lapped and polished to form very finely polished surfaces with very low remnant damage from the previous fabrication steps.

Described herein are various embodiments for fabricating a radiation detector. As used herein, a configuration in which a first element that is formed or located "over" a second element is a configuration in which the first element and the second element are in a generally facing configuration, and may, or may not, have a direct contact (physical contact) between the first and second elements. A configuration in which a first element that is formed or located "on" a second element is a configuration in which the first element and the second element are attached to each other directly or through at least one intermediate element. A configuration in which a first element that is formed or located "directly on" a second element is a configuration in which the first element and the second element are in physical contact with each other. Ordinals such as "first" and "second" are employed merely to distinguish similar elements, and different ordinals may be employed to refer to same elements across the specification and the claims. A "top" side and a "bottom" side refer to relative orientations when a structure is viewed in a certain manner, and orientations of a structure and labeling of respective portions change upon rotation of the structure.

To prevent the detrimental effect of the low surface resistance of the regions between the anodes, in certain embodiments the first surface of the semiconductor wafer is mechanically polished by a sequence including a plurality of polishing steps, wherein a last polishing step of the polishing sequence includes polishing with slurry having a grain size smaller than about 0.1 μm to form a polished first surface. Certain embodiments also include growing a first passivation oxide layer on top of the polished first surface using a dry process without wet chemical etching, in order to passivate and stabilize the polished first surface. Then patterned metal contacts are deposited on top of the first passivation oxide layer having at least one pattern being (i) a pattern of pixel anodes or (ii) a pattern of pixel anodes with grid electrodes having lines of electrodes aligned along centers of gaps between the anodes.

While the first passivation oxide layer on top of the polished first surface passivates and stabilizes the polished first surface, the first passivation oxide layer is not absolutely immune to impairment by humidity and other atmospheric gases and possible damage during handling. Thus, in order protect the first passivation oxide layer which is exposed in the regions between the anode pixels against degrading effect which will deteriorate the long-time reliability of the detectors, in certain embodiments an encapsulating layer is applied on top of the first passivation oxide layer and the overlaid pattern of metallic contacts of the anode surface. This layer is delineated in such a way that openings are formed in it, coinciding with the anode pixel contacts, where the dimensions of these openings are smaller than the dimensions of the contacts. These openings allow efficient and reliable attachment of the radiation detector to a carrier of electronic devices, which has contacts geometrically matching to the anode contacts, by using a conductive material (either conductive epoxy or low-temperature solder.)

In certain embodiments, the second surface is etched by chemical wet etching in order to remove the remnant mechanical damage from previous fabrication steps and to make it tellurium rich, to produce a desired electrical contact. These embodiments also include application of a protecting layer on the patterned deposited metal contacts to protect the metal pattern on the first surface, etching a second surface of the semiconductor and applying a monolithic cathode electrode on the etched second surface of the semiconductor, then removing the protecting layer from the patterned metal contacts on the first surface.

Various embodiments provide methods for fabricating a radiation detector, such as a pixelated radiation detector without chemical etching to remove damaged layers. Accordingly, in various embodiments, no chemical etching is used between the anode contacts.

Various embodiments provide methods for fabricating a radiation detector, such as a radiation detector where the cathode side is fabricated without chemical etching to remove damaged layers. Accordingly, in various embodiments, no chemical etching is used to form the cathode contacts.

Methods are described below for fabricating a radiation detector, such as a pixelated radiation detector wherein the surface of the anodes is produced by a complete dry-process with no wet chemical etch, which may be active after the detector fabrication and may result in lower surface resistivity and detector performances that degrade less with time. In these methods the surface side of the anodes is passivated, by a passivation process, which produces surface stabilization that may result in high surface resistivity.

Methods are described below for fabricating a radiation detector may further include encapsulation of the inter-pixel regions of the first passivation oxide layer which are exposed to the atmosphere in order to prevent degradation of the passivation effect of that layer. The methods described below include the deposition of a layer of Aluminum Nitride (AlN) on top of the first passivation oxide layer and the overlaid pattern of metallic contacts of the anode surface, and then delineating (i.e., patterning) it to form openings that coincide with the pixel anode contacts, where the dimensions of these openings are smaller than the dimensions of the contacts. This method thus offers an effective encapsulating of the detector since no portion of the first passivation oxide layer is exposed to environmental deleterious effects and possible damage during handling. Further, such a method offers a safe and efficient way to attach the radiation detector to a carrier of electronic devices by using a conductive material, such as conductive epoxy or low-temperature solder metal, for contacting the anode pixels to the contacts on the carrier.

Methods are described below for fabricating a radiation detector, such as a detector wherein the surface of the cathode is produced by a complete dry-process with no wet chemical etch, which may be active after the detector fabrication and may result in lower surface resistivity and detector performances that degrade less with time. In these methods the surface side of the cathode is passivated, by a passivation process, which stabilizes the surface, resulting in high surface resistivity.

Methods are described below for producing a pixelated semiconductor radiation detector may be performed by a simple process which on the anodes side does not include any wet chemical etching, lift-off process, and may not include photolithography in some embodiments. The pixelated semiconductor radiation detectors produced in accordance with various embodiments may have electrical contacts as anodes that are deposited on the first passivation oxide layer, which by nature of being a very thin oxide, facilitates carrier tunneling through it via defect levels within said layer.

The methods described below to produce a pixelated semiconductor radiation detector may be performed by a simple process which on the cathode side as well does not include any wet chemical etching, lift-off process, and may not include photolithography in some embodiments. The pixelated semiconductor radiation detectors produced in accordance with various embodiments may have electrical contacts as monolithic, segmented or pixelated cathodes that are deposited on a second passivation oxide layer, which by nature of being a very thin oxide, facilitates carrier tunneling through it via defect levels within said layer.

In various embodiments a dry fabrication process may be provided as illustrated in FIGS. 1-4A, for example, to fabricate pixelated radiation detector as is described below. In particular, FIG. 1 illustrates the first processing step of producing a radiation detector. FIG. 1 schematically shows the semiconductor substrate (e.g., semiconductor wafer) 100, such as a cadmium zinc telluride (CZT) wafer, having a top, first surface 101 and a lower, second surface 102. In the first fabrication step as shown in FIG. 1, the first and second surfaces 101 and 102 of the semiconductor wafer 100 are mechanically lapped and polished in a process that may include double sided lapping and polishing or consecutive one sided lapping and polishing, later referred to in general as polishing. The polishing includes several polishing steps in which each successive polishing step is performed with a slurry having grains (i.e., polishing particles), such as alumina, silicon carbide or diamond grains, which are smaller than the grains in the slurry of the previous polishing step. In each polishing step of the semiconductor wafer 100, the mechanical damage left on the surface of semiconductor wafer 100, after the polishing step, is proportional to the grain size in the slurry used in this polishing step. The last polishing step of the polishing sequence includes polishing with slurry having a grain size smaller than 0.1 µm to form very finely polished surfaces with very low remnant damage from the previous fabrication steps.

Figure 2:
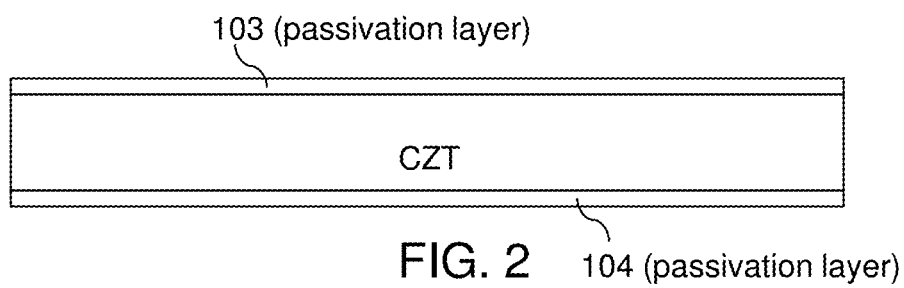
FIG. 2 is a side cross section view which shows the formation of a first passivation oxide layer 103 grown on the first surface 101 of the semiconductor wafer 100 and a second passivation oxide layer 104 grown on the second surface 102 of the semiconductor wafer 100.

FIG. 2 shows the formation of a first passivation oxide layer 103 grown on the first surface 101 of the semiconductor wafer 100 and a second passivation oxide layer 104 grown on the second surface 102 of the semiconductor wafer 100. The first passivation oxide layer 103 and the second passivation oxide layer 104 may be formed by growing those passivation layers on top of the semiconductor wafer 100 in one embodiment using a plasma process that may include steps of:

1. Cleaning the first and second surfaces 101 and 102 by using plasma of argon, hydrogen or a mixture of them and with other gases to clean the first and second surfaces 101 and 102 from any residual contamination from the polishing process that might have been not entirely cleaned by the routine cleaning stages following the polishing stage. The cleaning process is enabled by creating volatile components of the remnant contamination which is purged out of the chamber where the semiconductor wafer 100 is placed. The plasma of the mixture of gasses is formed by of the gases by coupling energy necessary for plasma creation by frequencies in the kHz range or frequencies in the MHz range, or by frequencies in the microwave (GHz) radiation, or by DC high voltage, or by discharge mechanism or DC magnetron inside a sputtering or an E-beam chamber.

2. Growing a first passivation oxide layer 103 on the top first surface 101 and a second passivation oxide layer 104 on the lower second surface 102 by a flow of oxygen plasma at a pressure lower than 1 mTorr at a sufficient flow rate to sustain the pressure. The plasma of the oxygen is formed by an ionizing process by coupling enough power necessary for plasma creation by frequencies in the kHz range or frequencies in the MHz range, or by frequencies in the microwave (GHz) radiation, or by DC high voltage, or by discharge mechanism or DC magnetron inside a sputtering or an E-beam chamber.

The thicknesses of the first and second passivation oxide layers 103 and 104 can be a few nanometers (nm) each. This thickness increases with the plasma processing time until reaching a saturated thickness value of about 5-6 nm.

In the case of the CZT semiconductor wafer 100, the first and second passivation oxide layers 103 and 104 include a combination of Tellurium Oxide ($TeO_2$), TeO, CdO, $CdTeO_3$, and/or $TeO_3$. This passivation layer, by nature of being a very thin oxide, provides a strong tunneling effect through it.

Figure 3:
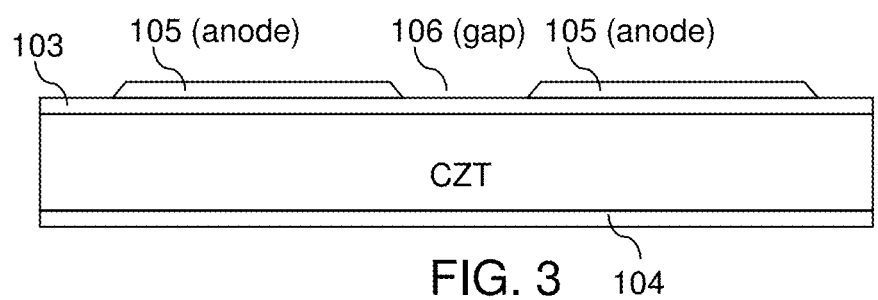
FIG. 3 is a side cross section view which schematically illustrates the step of the application of metal contacts on top of the first passivation oxide layer 103 to form anodes 105 with gaps 106 between the anodes 105.

FIG. 3 schematically illustrates the step of the application of metal contacts on top of the first passivation oxide layer 103 to form anodes 105 (i.e., anode electrode pixels) with gaps 106 between the anodes 105. Portions of the top surface of the grown first passivation oxide layer 103 are physically exposed at the gaps 106. Without the passivation oxide layer 103, the semiconductor wafer 100 would be exposed at the gaps 106, causing low surface resistance between the anodes 105, and thus impairing the performance of the radiation detector. The presence of the first passivation oxide layer 103 at the gaps 106 provides a high surface resistance between the anodes 105 for use in a high performance radiation detector.

The first passivation oxide layer 103 ensures that the CZT surface under layer 103 is chemically inactive since it has not been chemically etched and the passivation process has stabilized its surface states. Thus, the surface is very stable and suitable for producing radiation detectors that do not degrade with time.

The anodes 105 may be deposited by a physical vapor deposition method (e.g., evaporation or sputtering) in a vacuum chamber or by a chemical deposition method (e.g., chemical plating, electroplating or chemical vapor deposition). The anodes 105 may be patterned during physical vapor deposition by shadow-mask methods or after deposition by physical or chemical deposition methods by photolithography and etching techniques.

Figure 4A:
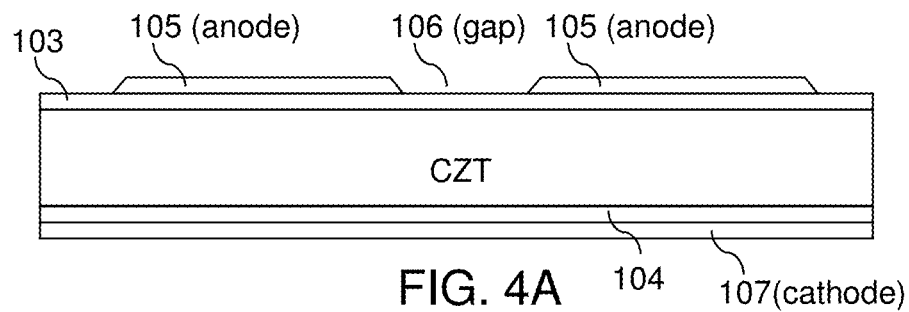
FIG. 4A is a side cross section view which schematically illustrates the step of the application of cathode contact 107, which may be applied as a monolithic, segmented or pixelated electrode on top of the second passivation oxide layer 104 which is on top of the second surface 102 of the semiconductor wafer 100. The steps described in FIG. 3 or FIG. 4A can be interchanged. In other words, the cathode contact can be deposited first and then the anode contact can be performed second.

FIG. 4A schematically illustrates the step of the application of cathode (e.g., cathode contact) 107, which may be applied as a monolithic, segmented or pixelated electrode on top of the second passivation oxide layer 104 which is located on the second surface 102 of the semiconductor wafer 100. This cathode electrode 107 may be deposited by a physical vapor deposition method (e.g., evaporation or sputtering) in a vacuum chamber or by a chemical deposition method (e.g., chemical plating, electroplating or chemical vapor deposition). The cathode electrode 107 may be patterned during physical vapor deposition by shadow-mask methods or after deposition by physical or chemical deposition methods by photolithography and etching techniques.

The metals used to form the pixelated anode electrodes 105 and the cathode electrode 107 may include least one of indium, gold, platinum, nickel, titanium, chromium, aluminum, alloys thereof, or a stack of layers including some or all of these metals.

Figure 4B:
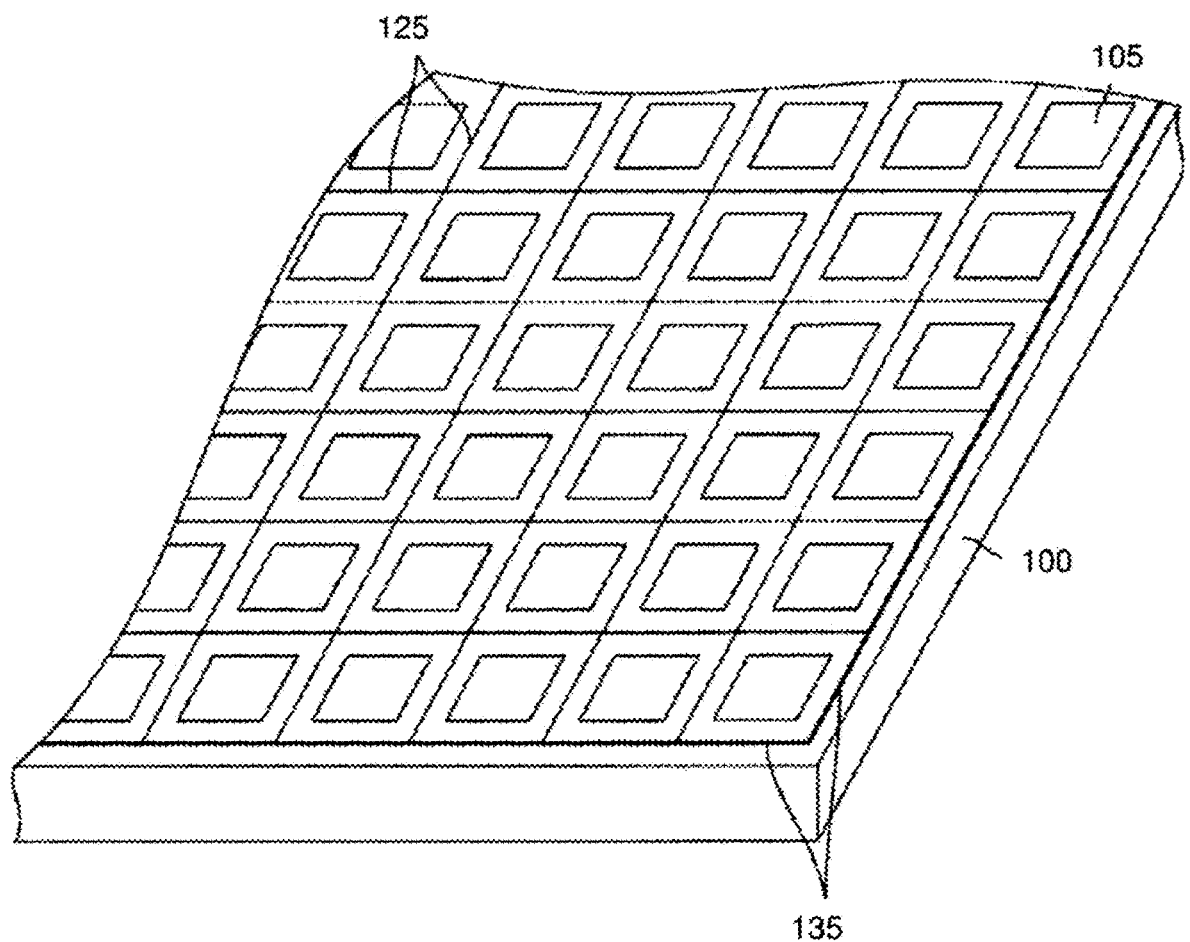
FIG. 4B is a perspective view of the device of FIG. 4A with lines of grid extending along centers of gaps between the anodes and encompassed by a continuous or segmented metal band referred to as a guard ring.

As shown in FIG. 4B, the patterned metal contacts deposited on top of the first passivation oxide layer 103 located on top of the first surface 101 have at least one pattern selected from: (i) a pattern of pixel anodes 105; (ii) a pattern of pixel anodes 105 with grid electrodes 125 comprising lines of steering grid electrodes aligned along centers of gaps 106 between the anodes 105; or (iii) a pattern of pixilated anodes 105 with grid electrodes 125 and a guard ring 135, which comprises a continuous or segmented metal band encompassing (i.e., surrounding) the anodes 105.

In one embodiment, a method for fabricating a radiation detector is provided. The method can include the steps of: mechanically polishing the first and the second surfaces of a semiconductor wafer using a polishing sequence including a plurality of polishing steps, wherein a last polishing step of the polishing sequence includes polishing with a slurry having a grain size smaller than 0.1 μm to form polished first and second surfaces; growing a passivation oxide layer (i) on a top of the polished first and second surfaces to passivate those surfaces or (ii) on top of those polished surfaces that are subsequently chemically etched prior to the passivation; depositing patterned metal contacts on top of the passivation oxide layer which is on top of the first surface having at least one pattern being (i) a pattern of pixel anodes, or (ii) a pattern of pixel anodes with grid electrodes having lines of electrodes aligned along centers of gaps between the anodes, or (iii) having patterns (i) or (ii) encompassed by a continuous or segmented metal band referred to as a guard ring; and applying a monolithic, segmented or pixelated cathode electrode on top of the passivation oxide layer which is on top of the second surface of the semiconductor.

In one embodiment, the semiconductor wafer can be one of an N-Type semiconductor, a P-Type semiconductor or intrinsic semiconductor. In one embodiment, the grid electrodes can be a steering grid that is biased by a voltage potential equal to or lower than the voltage potential of the anodes. In one embodiment, the guard ring electrode can be biased by a voltage potential equal to or lower than the voltage potential of the anodes. In one embodiment, the semiconductor wafer may comprise Cadmium Zinc Telluride (CZT). In one embodiment, the passivation layer comprises a combination of Tellurium Oxide ($TeO_2$), TeO, CdO, $CdTeO_3$, and/or $TeO_3$. In one embodiment, the passivation oxide layer is grown on the semiconductor wafer using a plasma oxidation process. In one embodiment, the plasma process includes ionizing of gas by coupling energy necessary for plasma creation by: (i) frequencies in the kHz range (e.g., 1-999 kHz), or (ii) frequencies in the MHz range (e.g., 1-999 MHz), or (iii) by frequencies in the microwave (GHz) radiation (e.g., 1-999 GHz), or (iv) by DC high voltage (e.g., 300-800 V), or (v) by discharge mechanism or DC magnetron inside a sputtering or an electron beam chamber. In one embodiment, the gas is an oxidant gas, such as oxygen, or a mixture of gases including oxidant gas, such as oxygen.

In one embodiment, the pixelated anode electrodes and the cathode electrode are formed from a metal, the metal being at least one of indium, gold, platinum, nickel, titanium, chromium, aluminum, their alloys, or a stack of layers including some or all of these metals. In one embodiment, the patterned metal is applied to the semiconductor wafer by physical deposition comprising evaporation or sputtering or by chemical deposition and patterned using photolithography or shadow-mask methods. In one embodiment, the first and second surfaces of the semiconductor wafer are polished simultaneously in a same fabrication step. In one embodiment, the first and second surfaces of the semiconductor wafer are polished in a plurality of different fabrication steps. In one embodiment, the pixelated anode electrodes and the cathode electrode are applied to the semiconductor wafer in a plurality of different fabrication steps.

FIGS. 5A-5D schematically illustrates the steps of forming the encapsulating layer of MN on top of the exposed passivation oxide layer in the regions between the anodes using a lift off method. In some embodiments, the encapsulating layer may be formed on the device shown in FIGS. 4A and 4B using the method illustrated in FIGS. 5A-5D. However, in alternative embodiments, the encapsulating layer may be formed using the method illustrated in FIGS. 5A-5D on radiation detector devices other than those shown in FIGS. 4A and 4B.

Figure 5A:
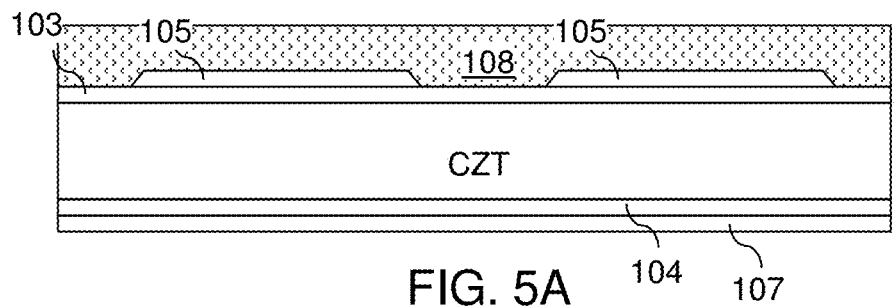
FIGS. 5A-5D schematically illustrate side cross sectional views of the steps of the application of encapsulating layer of AlN on top of the exposed passivation oxide layer in the regions between the anodes.

Referring to FIG. 5A, the first passivation oxide layer 103 located the anode side first surface 101 of the wafer 100 and the overlying pattern of metallic contacts (e.g., anodes 105 and optionally steering electrodes 125 and/or guard ring 135) located over the first passivation oxide layer 103 are covered with a mask 108, such as a photoresist mask or another suitable mask, such as any other sacrificial layer such as polymer film and lift-off resists, such as polydimethylglutarimide (pmgi), used to enhance lift-off processes.

Figure 5B:
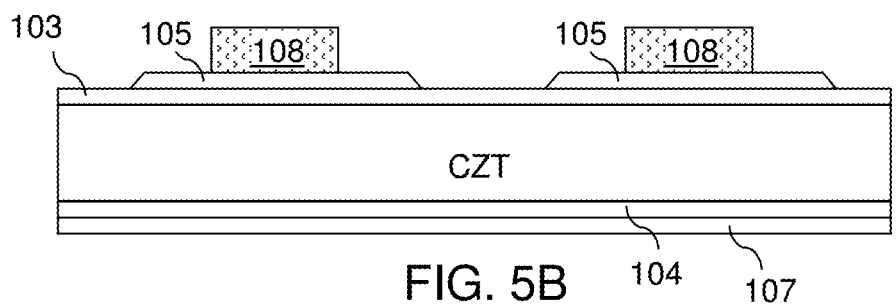

Referring to FIG. 5B, the mask 108 is then exposed and developed in such a way that the area of the developed lift-off mask pattern 108 (e.g., a photoresist or sacrificial mask pattern) is geometrically coincident with the pattern of metallic contacts (e.g., anodes 105 and optionally steering electrodes 125 and/or guard ring 135). The lateral dimensions of the developed lift-off mask 108 pattern are less than the dimensions of the contacts (e.g., the mask patterns are narrower than respective underlying anodes 105).

Figure 5C:
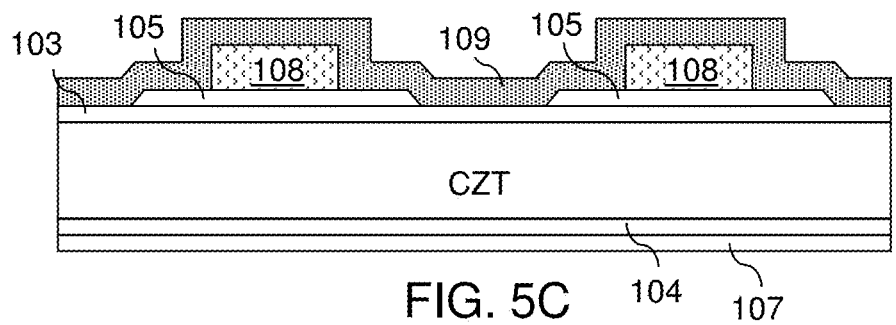

Referring to FIG. 5C, an encapsulating layer 109 of a dielectric material is applied over the first passivation oxide layer 103, the pattern of metallic contacts (e.g., anodes 105, steering grid electrodes 125 and/or guard ring 135) and the developed lift-off mask 108 pattern (i.e., while the photoresist pattern is present). The dielectric material of the encapsulating layer 109 can be, for example, aluminum nitride (AlN). The thickness of the encapsulating layer 109 can be in a range from 3 nm to 1,000 nm, although lesser and greater thicknesses can also be employed.

Figure 5D:
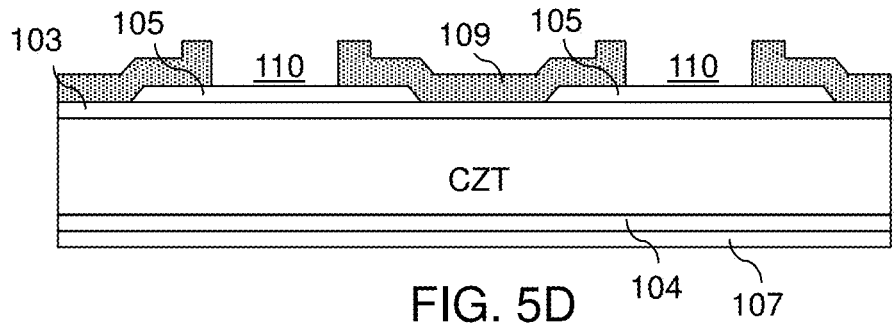

Referring to FIG. 5D, a lift-off technique is employed so that the lift-off mask 108 is lifted off, and openings 110 are formed in the encapsulating layer 109 in areas from which the lift-off mask and an overlying portion of the encapsulating layer 109 are removed. The openings 110 in the encapsulating layer 109 geometrically coincide with center areas of the pattern of metallic contacts (e.g., center of the anodes 105). The lateral dimensions of the openings 110 in the encapsulating layer 109 are less than the dimensions of the underlying pattern of metallic contacts (i.e., the lateral dimension of the openings 110 is narrower than the lateral dimension of the underlying anodes 105 and optionally narrower than the width of the steering grid electrodes and/or guard ring).

In other embodiments, an encapsulating layer can be formed on top of the exposed passivation oxide layer in the regions between the anodes employing a photolithography and two step etching method illustrated in FIGS. 6A-6F. In some embodiments, the encapsulating layer may be formed and patterned on the device shown in FIGS. 4A and 4B using the method illustrated in FIGS. 6A-6F. However, in alternative embodiments, the encapsulating layer may be formed and patterned using the method illustrated in FIGS. 6A-6F on radiation detector devices other than those shown in FIGS. 4A and 4B.

Figure 6A:
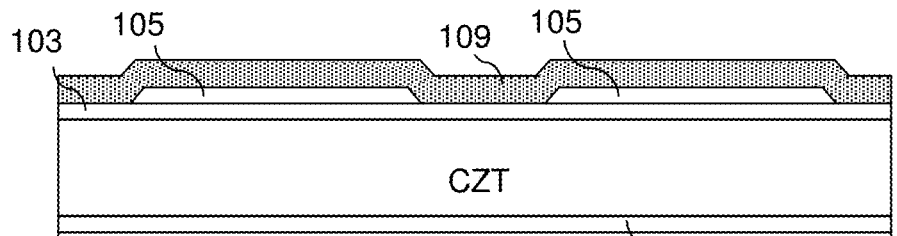
FIGS. 6A-6F schematically illustrate side cross sectional views the steps of another method of application of encapsulating layer of AlN on top of the exposed passivation oxide layer in the regions between the anodes.

Referring to FIG. 6A, an encapsulating layer 109 of a dielectric material is formed on top of the first passivation oxide layer 103 and the pattern of metallic contacts (e.g., anodes 105 and optionally steering electrodes 125 and/or guard ring 135). The dielectric material of the encapsulating layer 109 can be, for example, aluminum nitride (AlN). The thickness of the encapsulating layer 109 can be in a range from 3 nm to 1,000 nm, although lesser and greater thicknesses can also be employed.

Figure 6B:
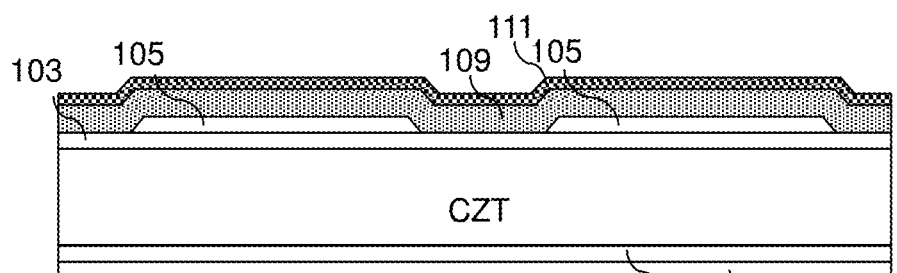

Referring to FIG. 6B, the continuous encapsulating layer 109 (which can include, for example, AlN) is covered with a metallic layer (i.e., metal hard mask) 111, which can be, for example, a thin layer of titanium (Ti), tungsten (W) or tantalum (Ta) or another metal hard mask having a thickness in a range from 3 nm to 300 nm.

Figure 6C:
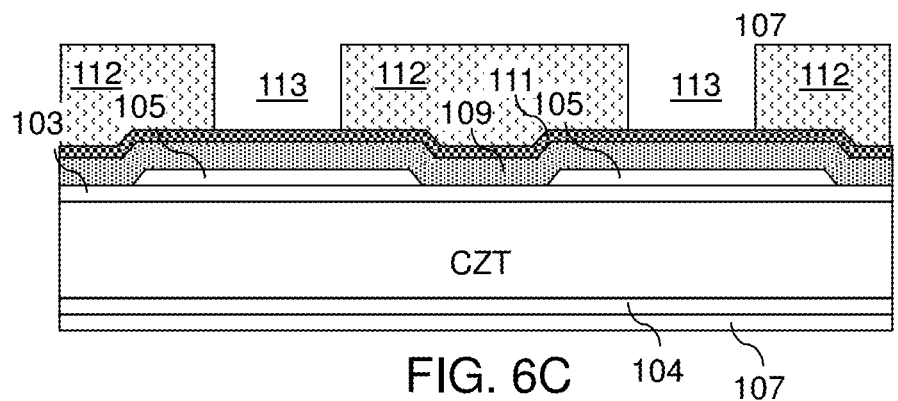

Referring to FIG. 6C, the metallic layer 111 is covered with a photoresist layer 112. The photoresist layer 112 is exposed and developed in such a way as to form openings 113 therein. The openings 113 geometrically coincide with center portions of the pattern of metallic contacts (e.g., anodes 105 and optionally steering electrodes 125 and/or guard ring 135). The lateral dimensions of the openings 113 are less than the lateral dimensions of the anodes 105 (i.e., the width of the openings 113 is narrower than the width of the anodes 105).

Figure 6D:
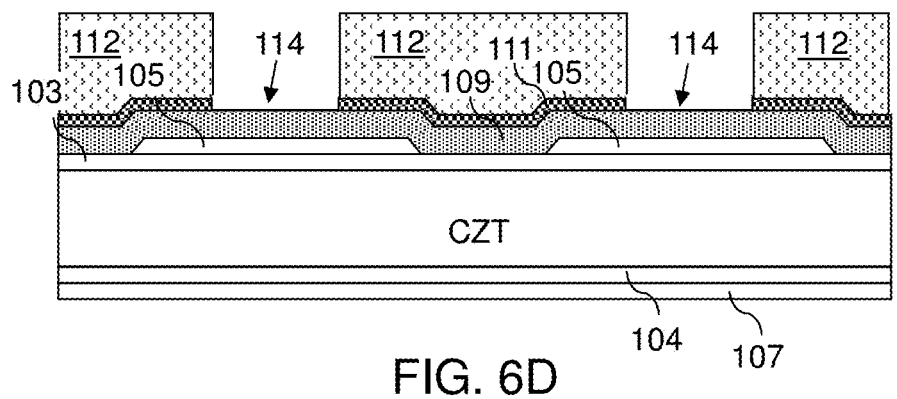

Referring to FIG. 6D, the metallic layer 111 is etched through the openings in the photoresist layer 112. Preferably, a wet etch using an acidic etchant (i.e., having a pH less than 7) is used to etch openings in the metallic layer 111. For example, if the metallic layer 111 includes titanium, a wet etch employing diluted HF acid or a buffered solution of HF can be employed. In one embodiment, the acid etchant that does not attack the underlying encapsulating layer 109 (which may be, for example, an AlN layer) can be employed for the wet etch process. Openings 114 are formed in the metallic layer 111 using the encapsulating layer 109 as an etch stop. The openings 114 geometrically coincide with center portions of the anodes 105. The lateral dimensions of the openings 114 are less than the lateral dimensions of the anodes (i.e., the openings 114 are narrower than the anodes 105). The patterned photoresist 112 may be removed or retained after the step of forming the openings 114 in the metallic layer 111.

Figure 6E:
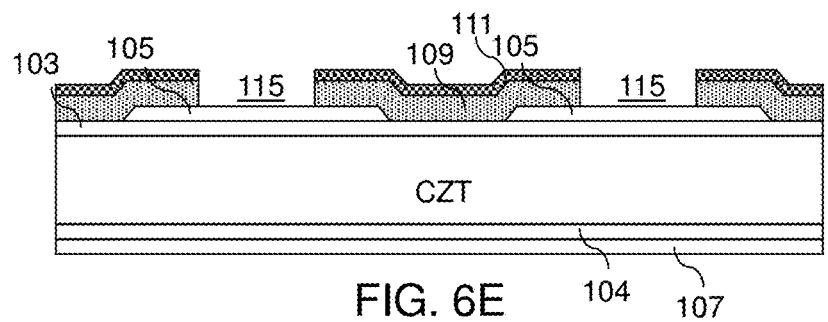

Referring to FIG. 6E, the encapsulating layer 109 is etched through the openings 114 in the metallic layer 111. In one embodiment, a wet etch that etches the material of the encapsulating layer 109 selective to the material of the metallic layer 111 can be employed. Preferably, the wet etch uses a basic etchant (i.e., having a pH greater than 7). For example, in case the encapsulating layer 109 includes AlN, a wet etch employing a potassium hydroxide (KOH) solution or other basic etchants can be performed. Such AlN etchants do not attack the metallic material (such as titanium) or the underlying anodes 105. Thus, openings 115 are formed in the encapsulating layer 109. The openings 115 geometrically coincide with center portions of the pattern of metallic contacts (e.g., anodes 105 and optionally steering electrodes 125 and/or guard ring 135). The lateral dimensions of the openings 115 are less than the lateral dimensions of the pattern of metallic contacts (e.g., the openings 115 are narrower than the respective underlying anodes 105). The two step etching process using the hard mask 111 and both acidic and basic etchants is advantageous because a typical low cost photoresist 112 is typically etched by basic etchants, such as KOH, may be used. Therefore, if the hard mask 111 is omitted, then a special, more expensive photoresist which is not etched by KOH is required as a mask. In contrast, by using the hard mask 111 as an etch stop, a low cost photoresist 112 may be used as a mask for etching the metallic hard mask 111 using an acidic etchant. The photoresist 112 may be removed after this etching step, and the AlN layer 109 may then be etched using the basic etchant using the metallic hard mask 111 as a mask.

Figure 6F:
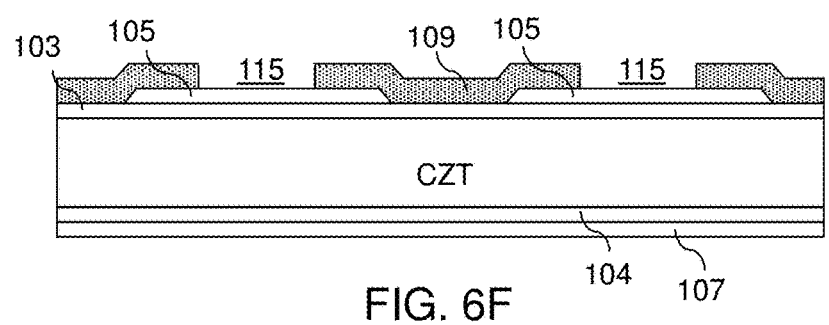

Referring to FIG. 6F, the remaining metallic layer 111 (which can be a titanium layer) can be removed by etching with a diluted HF acid, or with a buffered solution of HF.

Thus, in one embodiment, the method can comprise depositing a layer of aluminum nitride (AlN) as the encapsulating layer on top of the passivation oxide and the overlaid pattern of metallic contacts; and patterning the encapsulating AlN layer in such a way that it has openings coinciding with the anodes, where the dimensions of these openings are smaller than the dimensions of the contacts. The patterning may include the lift off method of FIGS. 5A-5D or the photolithography and two step etching method of FIGS. 6A-6F. If desired, the semiconductor wafer 100 containing the anodes 105 and layer 109 may be diced into tiles through the spaces 106 between the anodes 105 along the dicing lines 140.

Thus, as described above in one embodiment illustrated in FIGS. 5A-5D, the encapsulating layer can be patterned by forming a photoresist pattern on the pattern of metallic contacts such that edge portions of the pixilated anodes are exposed by the photoresist pattern, depositing an AlN encapsulating layer over the edge portion of the pixilated anodes and over the photoresist pattern, and lifting-off the photoresist pattern and portions of the AlN layer encapsulating layer located over the photoresist pattern to form openings in the AlN layer encapsulating layer.

In another embodiment illustrated in FIGS. 6A-6F, the encapsulating layer can be patterned by depositing an aluminum nitride (AlN) encapsulating layer over the pattern of metallic contacts, forming a metallic hard mask layer over the AlN encapsulating layer, forming a photoresist pattern over the metallic hard mask layer, etching portions of the metallic hard mask layer exposed by the photoresist pattern using an acidic etchant and using the AlN encapsulating layer as an etch stop to form hard mask openings in the metallic hard mask layer, and etching portions of the AlN encapsulating layer exposed in the hard mask openings using a basic etchant to form the openings in the AlN encapsulating layer.

In one embodiment shown in FIG. 6G, the method can further comprise attaching the radiation detector 200 of FIG. 5D or FIG. 6F to a carrier 300 of electronic devices, such as an ASIC, a pin grid array or a printed circuit board. The carrier 300 has electrical contacts (e.g., electrodes or leads) 310 geometrically matching to the anodes 105. An electrically conductive material 210 is formed in the openings 115 in the encapsulating layer 109 to electrically connect the anodes 105 (and optionally the steering grid 125 and/or the guard ring 135) to the carrier electrical contacts 310. In one embodiment, the conductive material 210 is a conductive epoxy or a low-melting metallic alloy solder. If desired, one or more additional electrically insulating layers 120 and/or 320 may be formed between the carrier 300 and the radiation detector 200.

Detector Stability

Detector stability is desirable for various detector applications. For example, computerized tomography (CT) scanning applications may require a stability of 99.9% or higher (1 Hounsfield unit (HU)). The present inventors realized that one source of CZT detector instability is related to interface electron traps that are located on the surface of a semiconductor layer, such as a CZT layer, especially at interpixel gaps between the anodes 105.

Ideally, surface passivation would prevent the formation of all interface traps. However, current manufacturing processes generally do not produce ideal passivation, which results in interface states which act as electron traps. The interface states may also have a non-uniform trap distribution in different interpixel gaps.

Figure 7:
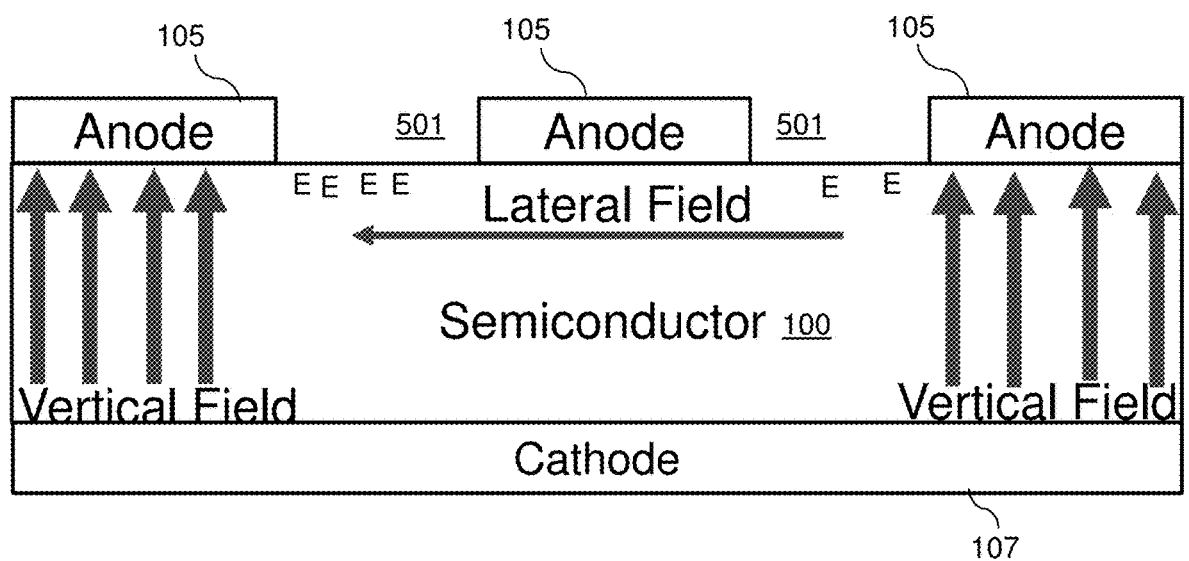
FIG. 7 is a side cross sectional view illustrating electric fields that may be formed in a radiation detector, such as a CZT detector, during operation.

FIG. 7 is a diagram illustrating electric fields that may be formed in a radiation detector, such as a CZT detector, during operation. Referring to FIG. 7, a vertical electric field may be formed between a cathode 107 and anodes 105 of the detector, by the application of a high voltage bias to the cathode. As electrons move through a semiconductor layer (e.g., wafer), from the cathode to anodes, some electrons E may become trapped in at the interface states (e.g., electron traps) located in the interpixel gaps 501 at the first (i.e., anode) surface of the semiconductor layer 100. Electrons trapped between the anodes 105 in the interpixel gaps 501 can only escape the interface trap state by a very slow process of hopping (i.e., tunneling) between states to get to an anode 105, because there is no external bias applied which creates an electric field between adjacent anodes 105.

The unequal distribution of trapped electrons in different interpixel gaps 501 may result in the formation of a horizontal electric field in the semiconductor layer 100 between the anodes 105. The horizontal electric field may influence the movement of electrons in the semiconductor layer, resulting in potential sensor response instabilities, such as charge exchange between pixels of a detector. The influence of the lateral electric field may be especially pronounced at lower applied biases, such as at applied voltages ranging from about 100V to about 900V. However, even when a high voltage bias is applied, such as voltages ranging from about 1000V to 1200V, or higher, response instabilities of greater than 0.1% may still occur, which is above acceptable instability limits for various detector applications where very high accuracy is desired. Furthermore, even if there is an equal number of surface states in most interpixel gaps 501, then the electrons trapped at such interface state traps may still decrease the stability of the detector.

In one embodiment of the present disclosure an electrically conductive pattern 500 is disposed in the interpixel regions 501 over (e.g., directly on or with an intervening dielectric layer) the semiconductor layer 100. The electrically conductive pattern 500 reduces the amount of electrons trapped at the interface state traps in the interpixel regions 501 by permitting the electrons to move vertically from the interface state traps in the semiconductor layer 100 into the electrically conductive pattern 500. The electrons can move through the electrically conductive pattern 500 much faster than through the semiconductor layer 100 below the interpixel gaps 510. Thus, such electrons may be dissipated into the anodes 105 faster than if the electrically conductive pattern was not present. The electrically conductive pattern 500 may also reduce the undesirable lateral electric field.

FIGS. 8A-8D are sectional views of radiation detectors 800, 802, 804, 806 which contains the electrically conductive pattern 500 according to various embodiments of the present disclosure. The detectors 800, 802, 804, 806, may be similar to the detectors described above with respect to FIGS. 4A, 4B, and 6F. Accordingly, only the differences there between will be discussed in detail, and like elements include the same reference numbers.

Figure 8A:
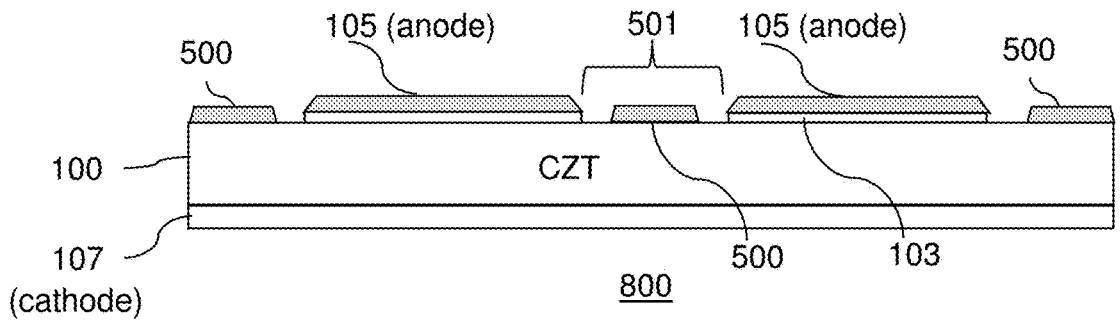
FIGS. 8A-8D are side cross sectional views of radiation detectors according to various embodiments of the present disclosure.

Referring to FIG. 8A, the detector 800 includes anodes 105 and a cathode 107 disposed on opposing first and second surfaces of a semiconductor layer 100. In some embodiments, the semiconductor layer 100 may be one of an N-type semiconductor, a P-type semiconductor, or an intrinsic semiconductor. In some embodiments, the semiconductor layer 100 may be a CZT semiconductor wafer or diced segment thereof.

The anodes 105 may be arranged over the first surface (e.g., the anode surface 101 shown in FIG. 1) of the semiconductor layer 100 in a pixel pattern, such that gaps are formed between adjacent anodes 105. In this embodiment, the passivation layer 103 may be prevented from being formed or may be at least partially etched away from the first surface of the semiconductor layer 100. For example, if the passivation layer 103 is formed as shown in FIG. 2, then the entire passivation layer 103 may be removed by selective etching after the step shown in FIG. 2. Alternatively, only the exposed portions of the passivation layer 103 located in the interpixel gaps 501 may be removed by selective etching after formation of the anodes 105 in the step shown in FIG. 3. In this configuration shown in FIG. 8A, the passivation layer 103 is present under anodes 105, but not in the interpixel gaps 501. Likewise, the second passivation layer 104 may optionally be omitted or etched away if desired in this embodiment.

Thus, in this embodiment, the anodes 105 and/or the cathode 107 may be respectively disposed directly on the first and second surfaces of the semiconductor layer 100. Alternatively, the anodes 105 and/or the cathode 107 may be respectively disposed on the respective passivation layers 103, 104, while the passivation layer 103 is not present in the interpixel gaps 501, as shown in FIG. 8A.

The detector 800 of this embodiment also includes the electrically conductive pattern 500 disposed directly on the first surface of the semiconductor layer 100, in the interpixel gaps 501 between the anodes 105. For example, the conductive pattern 500 may at least partially surround each anode 105. The conductive pattern 500 may be formed of any suitable electrically conductive material. For example, the conductive pattern 500 may be formed of indium, gold, platinum, nickel, titanium, chromium, aluminum, alloys thereof, or a stack thereof (e.g., a stack of layers including some or all of the above metals).

In some embodiments, the conductive pattern 500 may be formed of the same metal as the anodes 105. In such embodiments, the conductive pattern 500 and the anodes 105 may both be formed during the same deposition and patterning process, such as by deposition and patterning the same metal layer located over the semiconductor layer 100. However, in other embodiments, the anodes 105 and the conductive pattern 500 may be formed of different metals and/or by during different deposition and patterning steps or processes. For example, the conductive pattern 500 metal may be selected to reduce barrier height to reduce or prevent surface states getting into the conductive pattern 500, while the anode 105 metal is selected to provide the optimum conductivity or other anode properties.

At least a portion of the conductive pattern 500 is not externally electrically biased during operation and may be electrically floating. In particular, at least a portion of the conductive pattern 500 may be entirely unbiased or may be self-biased due to the movement of the electrons from the interface state traps in the interpixel regions 501 into the electrically conductive pattern 500. In other words, during operation of the detector 800 an external bias voltage or current is not applied to at least the portion of the conductive pattern 500 that is electrically floating. Accordingly, the conductive pattern 500 may operate to redistribute and/or otherwise collect electrons from interface state electron traps formed in the semiconductor layer 100 in the interpixel regions. As such, the conductive pattern 500 may be configured to reduce or prevent the electron trapping at the interface states and generation of the lateral electric field in the semiconductor layer 100 due the trapping of electrons at the interface states.

Figure 8B:
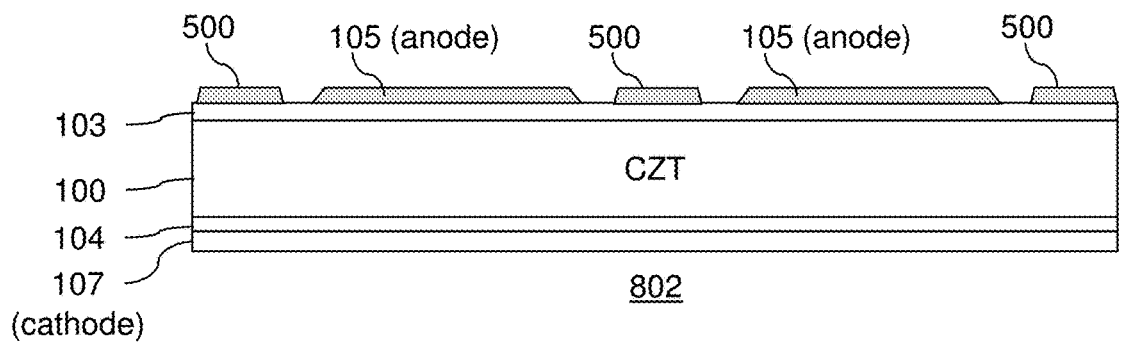

Referring to FIG. 8B, the radiation detector 802 may be similar to the detector 800 except for including a passivation layer 103 (e.g., a dielectric layer) disposed between the first surface of the semiconductor layer 100 and the conductive pattern 500. For example, the passivation layer 103 may be a continuous layer that completely covers the first (i.e., anode) surface of the semiconductor layer 100. However, in other embodiments, the passivation layer 103 may be disposed only between the semiconductor layer 100 and the conductive pattern 500.

In some embodiments, the passivation layer 103 may be formed of a metal or metal alloy oxide, or a metal nitride. For example, the passivation layer 103 may be a passivation layer formed of a native CZT oxide, such as a combination of at least two of $TeO_2$, TeO, CdO, $CdTeO_3$, and $TeO_3$. In other embodiments, the passivation layer may include a metal nitride such as AlN. However, the passivation layer 103 may be formed of any suitable material having a higher dielectric constant than the semiconductor layer 100.

The thickness of the passivation layer 103 may be on the order of a few nanometers (nm) in order to permit electrons to move from the semiconductor layer 100 to the conductive pattern 500. For example, the passivation layer 103 may have a thickness ranging from about 3 nm to about 10 nm, such as from about 5 nm to about 6 nm. In some embodiments, the detector 802 may optionally include a passivation layer 104 disposed between the cathode 107 and the second (i.e., cathode) surface of the semiconductor layer 100.

Figure 8C:
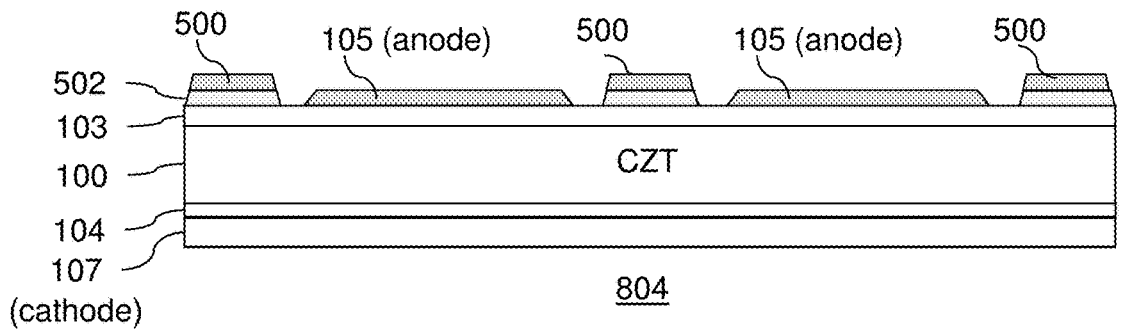

Referring to FIG. 8C, the detector 804 may be similar to the detector 800 except for including may include a patterned dielectric layer 502. In particular, the dielectric layer 502 may be patterned such that the dielectric layer 502 is disposed in the gaps between the anodes 105. For example, the dielectric layer 502 may completely cover the portions of the first surface of the semiconductor layer 100 exposed by the interpixel gaps 501 between the anodes 105, or may partially cover the exposed surface of the semiconductor layer 100.

The dielectric layer 502 may be formed of a metal oxide or a metal nitride as discussed above with respect to the passivation layer 103. For example, the dielectric layer 502 may have a thickness configured to permit the movement of electrons there through. The patterned dielectric layer 502 may be disposed directly on the upper surface of the semiconductor layer 100, in some embodiments.

In other embodiments, the detector 804 may optionally include the passivation layer 103 in addition to the dielectric layer 502. In these embodiments, the patterned dielectric layer 502 may be disposed on the passivation layer 103. The passivation layer 103 and the dielectric layer 502 may be formed of different ones of a semiconductor oxide (e.g., CZT oxide) and a metal nitride (e.g., aluminum nitride). The combined thickness of the layers 103, 502 may be set such that trapped electrons may pass there through from the semiconductor layer 100 and enter the conductive pattern 500. For example, the combined thickness of the passivation layer 103 and the dielectric layer 502 may range from about 3 nm to about 10 nm.

Figure 8D:
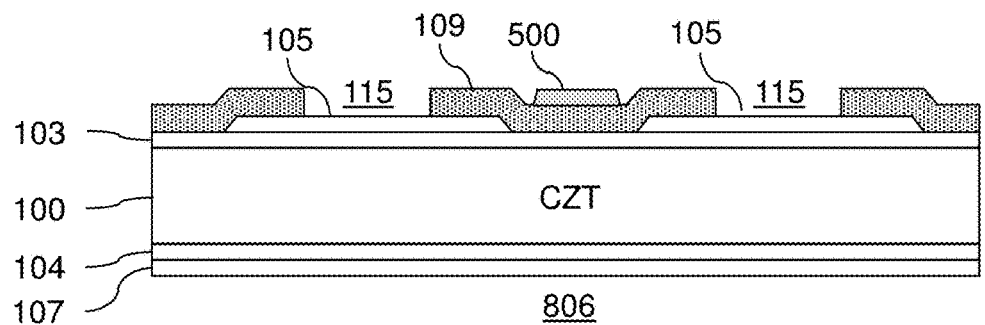

Referring to FIG. 8D, the detector 806 may be similar to the detector shown in FIG. 6F. In particular, the detector 806 may include an encapsulating layer 109 that partially covers anodes 105 of the detector 805, and a conductive pattern 500 disposed on the encapsulating layer 109. The encapsulating layer 109 may be formed of a dielectric material such as AlN. In some embodiments, the thickness of the encapsulating layer 109 may be set such that electrons trapped in the semiconductor layer 100 may enter the conductive pattern 500. For example, the encapsulating layer 109 may have a thickness ranging from about 3 nm to about 10 nm. The encapsulating layer 109 may partially cover the anodes 105 and may extend to cover side surfaces of the semiconductor layer 100. For example, the encapsulating layer 109 may include openings 115 that expose portions of the anodes 105.

The conductive pattern 500 may be deposited on the encapsulating layer 109, so as to be disposed in and/or face gaps between the anodes 105. For example, the conductive pattern 500 may be deposited on the encapsulating layer 109 before or after openings 115 are formed in the encapsulating layer 109. In embodiments where the conductive pattern 500 is deposited before the openings 115 are formed, the conductive pattern 500 may be used as a mask when forming the openings 115. The detector 806 may optionally include the passivation layers 103 and/or 104, as discussed above.

FIGS. 9A-9E are top views of conductive patterns 500A-500E that may be disposed on the semiconductor substrate 100 of a radiation detector, according to various embodiments of the present disclosure. For example, the conductive patterns 500A-500E may be used as the conductive pattern 500 of any of the detectors 800-806 of FIGS. 8A-8C.

Figure 9A:
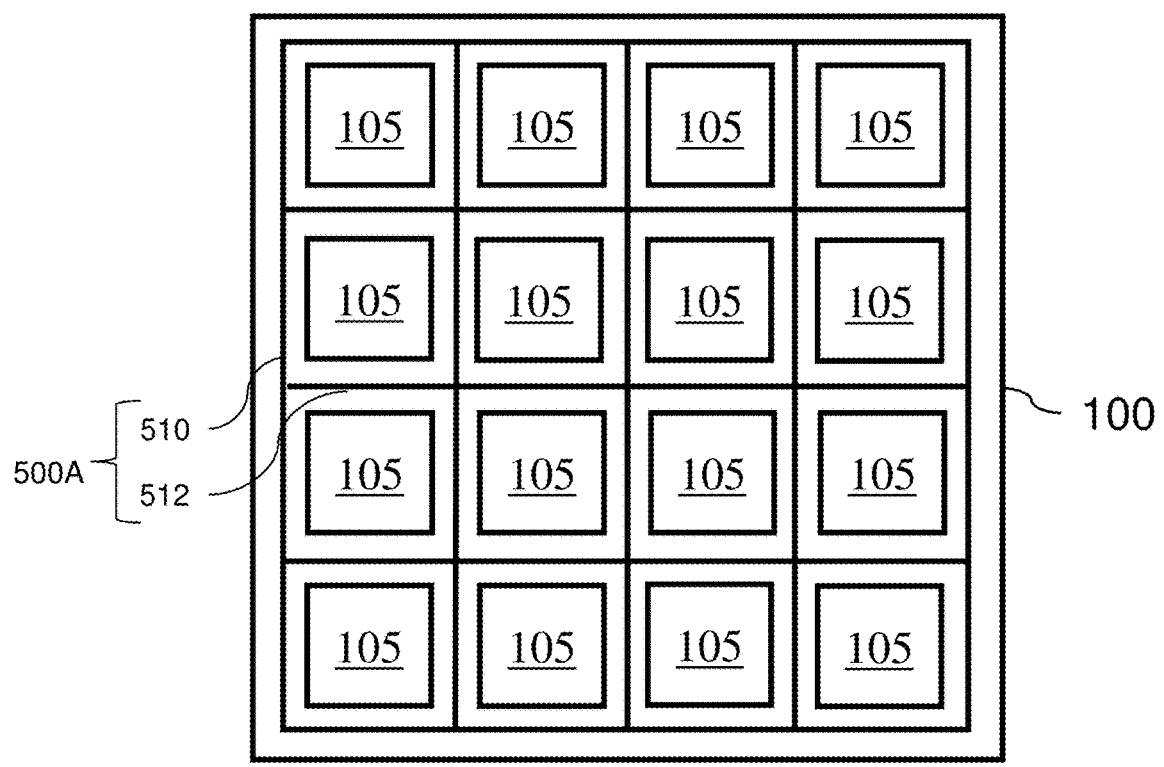
FIGS. 9A-9E are top views of conductive patterns that may be disposed on the semiconductor layer of a radiation detector, according to various embodiments of the present disclosure.

Referring to FIG. 9A, the conductive pattern 500A may be in the form of a grid or mesh surrounding each anode 105 disposed on the semiconductor substrate 100. Each anode 105 may represent one pixel of a radiation detector comprising the semiconductor substrate 100. The conductive pattern 500A may include first conductive lines 510 that extend in a first direction and second conductive lines 512 that extend across the first conductive lines 510 in a second direction perpendicular to the first direction. For example, the conductive lines 510, 512 may each extend along multiple anodes 105 or may extend between multiple adjacent pairs of anodes 105. In this embodiment, the conductive lines 510, 512 may be electrically connected to one another, and the entire conductive pattern 500A may be electrically floating without being electrically connected to an external bias source.

Figure 9B:
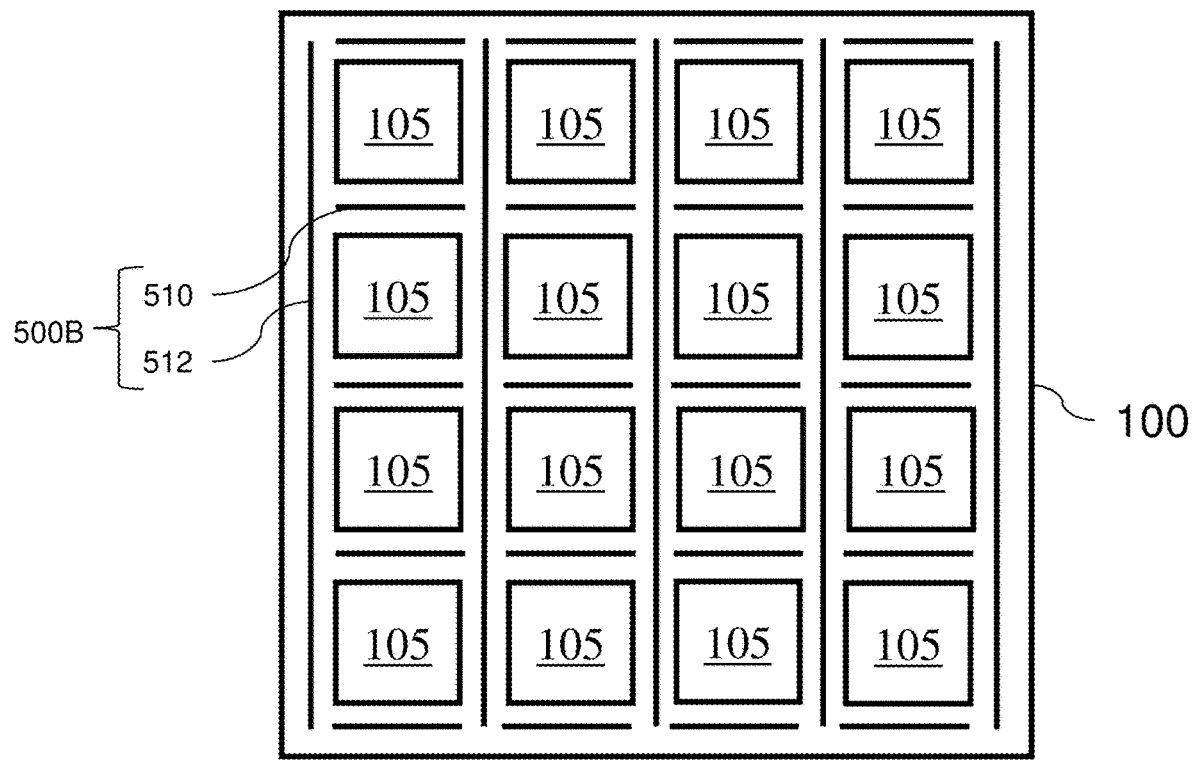

Referring to FIG. 9B, the conductive pattern 500B may be in the form of a discontinuous, segmented grid or mesh surrounding each anode 105 disposed on the semiconductor substrate 100. In particular, the conductive pattern 500B may include relatively long first conductive lines 510 that extend in a first direction, and relatively short second conductive lines 512 that extend in a second direction perpendicular to the first direction. The first conductive lines 510 may each extend along multiple anodes 105 or may extend between multiple adjacent pairs of anodes 105. In contrast, the second conductive lines 512 may extend along a single anode 105 or between a single pair of adjacent anodes 105. The conductive lines 510, 512 may be electrically disconnected from one another and may each be electrically floating without being electrically connected to an external bias source.

Figure 9C:
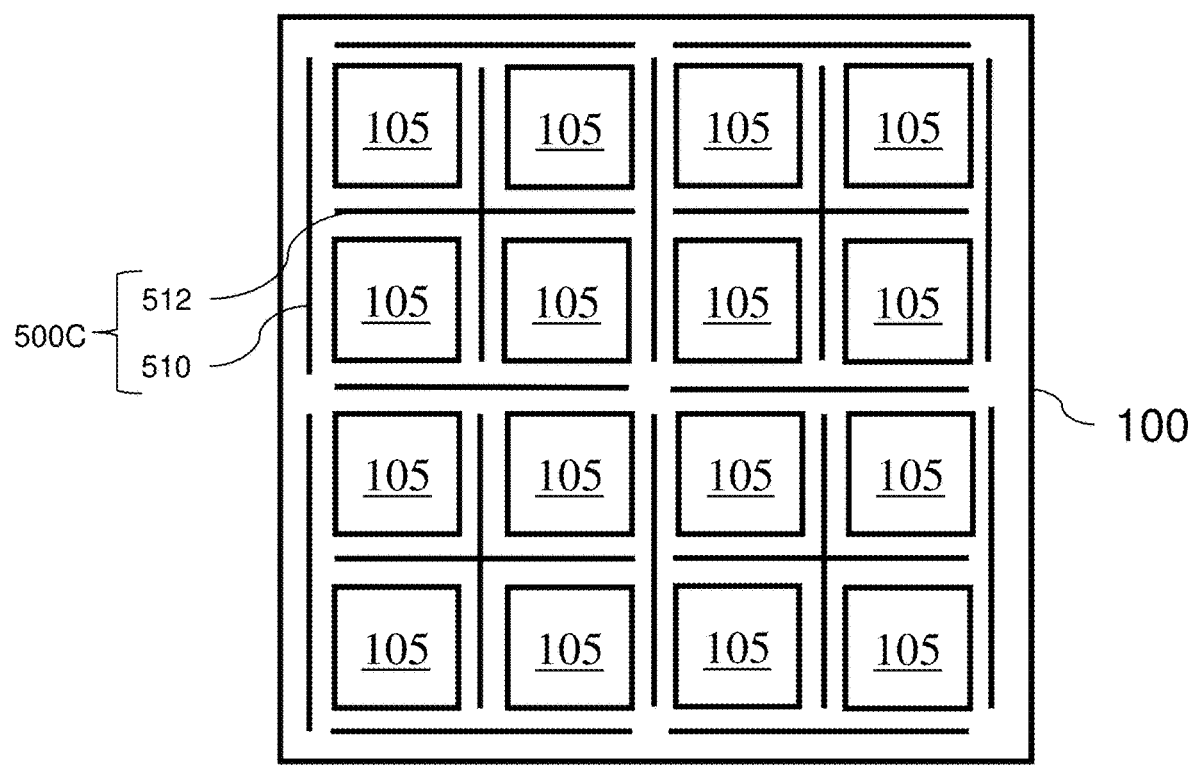

Referring to FIG. 9C, the conductive pattern 500C may be in the form of another discontinuous, segmented a grid or mesh surrounding each anode 105 disposed on the semiconductor substrate 100. In particular, the conductive pattern 500C may include first conductive lines 510 that extend in a first direction, and second conductive lines 512 that in a second direction perpendicular to the first direction. For example, the conductive lines 510, 512 may each extend along two or more anodes 105 or may extend between two or more adjacent pairs of anodes 105. A subset of the conductive lines 510, 512 may cross each other and may be electrically connected to each other. Another subset of the conductive lines 510, 512 may be electrically disconnected from other conductive lines. None of the conductive lines are electrically connected to an external bias source.

Figure 9D:
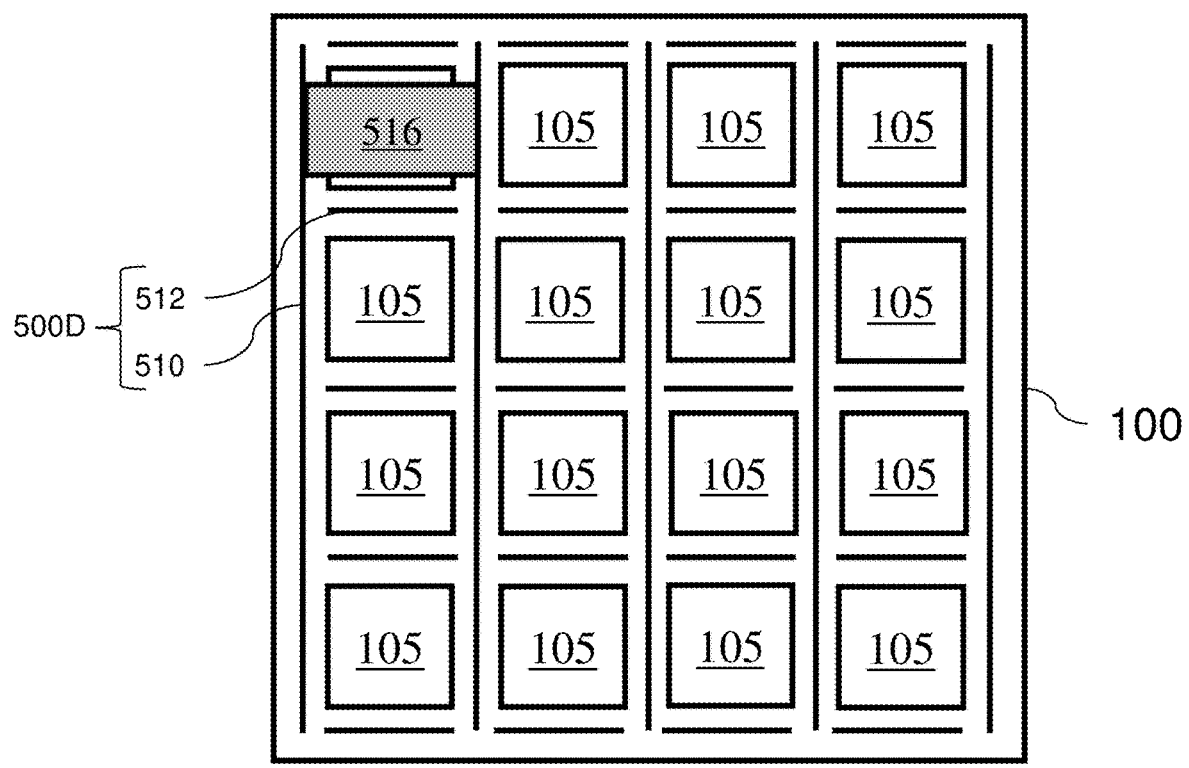

Referring to FIG. 9D, the conductive pattern 500D may be in the form of another discontinuous, segmented a grid or mesh surrounding each anode 105 disposed on the semiconductor substrate 100. In particular, the conductive pattern 500D may include first and second conductive lines 510, 512 arranged as discussed above with respect to FIG. 9B. However, a biasing electrode 516 may be electrically connected to a subset of the first conductive lines 510. The subset of the first conductive lines 510 may be biased by an external voltage equal to or less than the voltage potential of applied to the anodes 105 through the biasing electrode. Accordingly, a first portion (e.g., at least some of the first conductive lines 510) of the electrically conductive pattern 500 is electrically connected to the external bias source and is electrically biased during operation of the radiation detector, while a second portion (e.g., at least the second conductive lines 512) of the electrically conductive pattern 500 is not electrically connected to the external bias source and is electrically floating during operation of the radiation detector. The biasing electrode 516 may be electrically connected to an external bias source (e.g., external voltage source) and may be located in a dummy pixel in the corner of the array in order to limit the impact on detection.

Figure 9E:
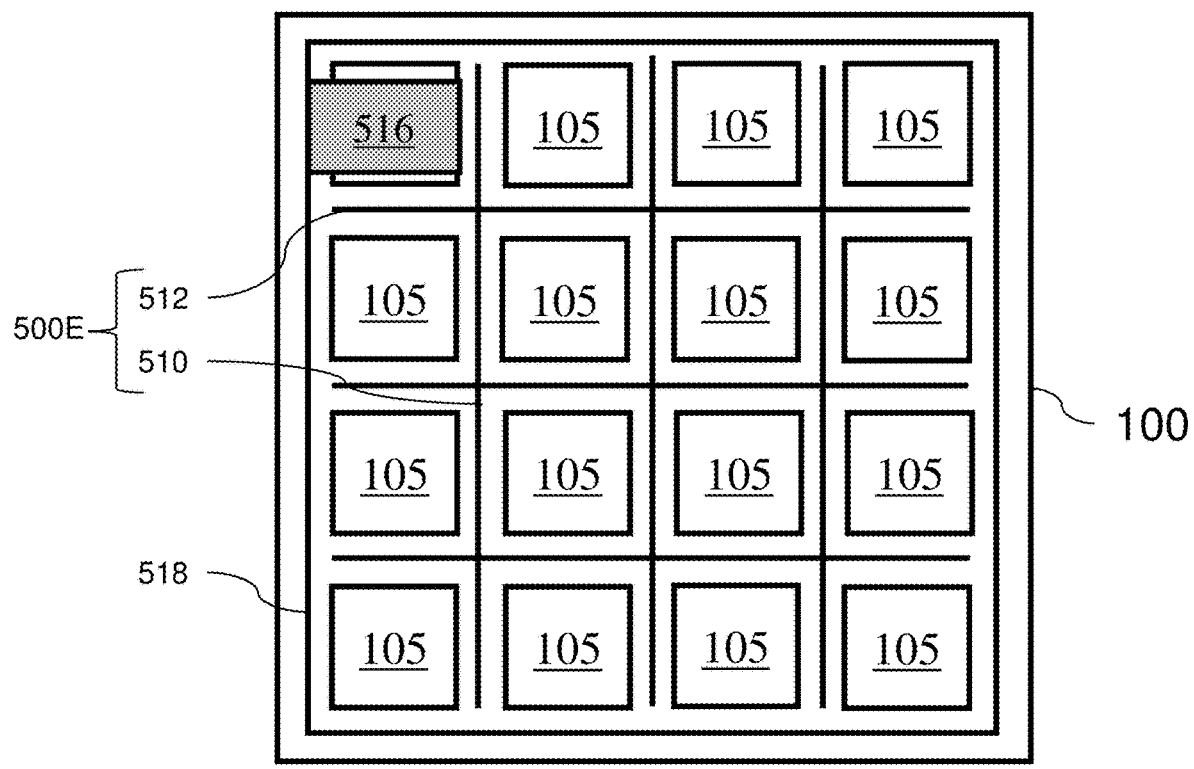

Referring to FIG. 9E, the conductive pattern 500E may be in the form of a grid or mesh that extends between each adjacent anode 105 disposed on a first side of the semiconductor substrate 100. The conductive pattern 500E may include first conductive lines 510 that extend in a first direction, and second conductive lines 512 that extend across the first conductive lines 510 in a second direction perpendicular to the first direction. The first and second conductive lines 510, 512 may be electrically connected to one another and electrically floating without being electrically connected to an external bias source.

The radiation detector may also include a guard ring electrode 518 that extends around the perimeter of the first side of substrate 100 and that is not electrically connected to at least part of the electrically conductive pattern 500 (e.g., to at least one of the first or second conductive lines 510, 512). A biasing electrode 516 may be electrically connected to the guard electrode 518 and to an external bias source (e.g., external voltage source). The guard ring electrode 518 may be biased by a voltage equal to or less than the voltage potential of applied to the anodes 105, without the first and/or second conductive lines 510, 512 being electrically connected to the external bias source.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

The invention claimed is:

1. A radiation detector, comprising:
a semiconductor layer having opposing first and second surfaces;
anodes disposed over the first surface of the semiconductor layer in a pixel pattern;
a cathode disposed over the second surface of the semiconductor layer; and
an electrically conductive pattern disposed over the first surface of the semiconductor layer in interpixel gaps between the anodes, wherein at least a portion of the electrically conductive pattern is not electrically connected to an external bias source.

2. The detector of claim 1, wherein at least a portion of the electrically conductive pattern is electrically floating during operation of the radiation detector.

3. The detector of claim 1, wherein the semiconductor layer comprises cadmium zinc telluride (CZT).

4. The detector of claim 1, wherein:
the electrically conductive pattern is in the form of a grid surrounding each of the anodes; and
the entire electrically conductive pattern is not electrically connected to the external bias source and is electrically floating during operation of the radiation detector.

5. The detector of claim 1, wherein:
a first portion of the electrically conductive pattern is electrically connected to the external bias source and is electrically biased during operation of the radiation detector; and
a second portion of the electrically conductive pattern is not electrically connected to the external bias source and is electrically floating during operation of the radiation detector.

6. The detector of claim 1, wherein the electrically conductive pattern and the anode electrodes are formed of a metal independently selected from indium, gold, platinum, nickel, titanium, chromium, aluminum, alloys thereof, or a stack thereof.

7. The detector of claim 6, wherein the electrically conductive pattern and the anodes are formed of the same metal.

8. The detector of claim 1, wherein the anodes and the electrically conductive pattern directly contact the first surface of the semiconductor layer.

9. The detector of claim 1, further comprising a first dielectric passivation layer disposed between the first surface of semiconductor layer and the electrically conductive pattern.

10. The detector of claim 9, wherein the first dielectric passivation layer comprises is selected from a combination of at least two of $TeO_2$, TeO, CdO, $CdTeO_3$, and $TeO_3$.

11. The detector of claim 8, wherein the first dielectric passivation layer is disposed between the first surface of semiconductor layer and the anodes, and the first dielectric passivation layer has a thickness ranging from about 3 nm to about 10 nm.

12. The detector of claim 9, further comprising a dielectric layer disposed between the passivation layer and the electrically conductive pattern.

13. The detector of claim 12, wherein:
the first dielectric passivation layer comprises a combination of at least two of $TeO_2$, TeO, CdO, $CdTeO_3$, and $TeO_3$; and
the dielectric layer comprises AlN.

14. The detector of claim 13, wherein the first passivation layer and the dielectric layer have a combined thickness ranging from about 3 nm to about 10 nm.

15. The detector of claim 12, further comprising a second passivation layer disposed between the cathode and the second surface of the semiconductor layer.

16. The detector of claim 1, further comprising an encapsulating layer comprising a dielectric material and disposed between the electrically conductive pattern and the semiconductor layer and partially covering the anodes.

17. The detector of claim 16, wherein the encapsulating layer at least partially covers edges of the semiconductor layer, and wherein the encapsulating layer comprises AlN.

18. The detector of claim 1, further comprising a guard ring electrode which is electrically connected to the external bias source and is not electrically connected to the electrically conductive pattern.

19. A method of operating the detector of claim 1, comprising:
- applying an external voltage between the cathode and the anodes; and
- not applying an external voltage to the at least portion of the electrically conductive pattern during the step of applying an external voltage between the cathode and the anodes.

20. The method of claim 19, wherein electrons move vertically in the interpixel gaps from the semiconductor layer into the electrically conductive pattern during the step of applying an external voltage between the cathode and the anodes.

\* \* \* \* \*